(12) United States Patent
Lavitsky et al.

(10) Patent No.: US 11,670,493 B2
(45) Date of Patent: Jun. 6, 2023

(54) ISOLATOR RING CLAMP AND PHYSICAL VAPOR DEPOSITION CHAMBER INCORPORATING SAME

(71) Applicant: APPLIED MATERIALS, INC., Santa Clara, CA (US)

(72) Inventors: Ilya Lavitsky, San Francisco, CA (US); Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 237 days.

(21) Appl. No.: 17/098,254

(22) Filed: Nov. 13, 2020

(65) Prior Publication Data

US 2022/0154329 A1    May 19, 2022

(51) Int. Cl.
*H01J 37/34* (2006.01)
*C23C 14/34* (2006.01)
*C23C 14/50* (2006.01)

(52) U.S. Cl.
CPC ...... *H01J 37/3435* (2013.01); *C23C 14/3407* (2013.01); *C23C 14/50* (2013.01); *H01J 37/3414* (2013.01); *H01J 37/3488* (2013.01)

(58) Field of Classification Search
CPC .............. H01J 37/3435; H01J 37/3414; H01J 37/3488; C23C 14/3407; C23C 14/50; C23C 14/564

USPC .................................................... 204/298.11
See application file for complete search history.

(56) References Cited

U.S. PATENT DOCUMENTS

| | | | |
|---|---|---|---|
| 5,449,410 A | 9/1995 | Chang et al. | |
| 5,690,795 A | 11/1997 | Rosenstein et al. | |
| 2003/0089601 A1 | 5/2003 | Ding et al. | |
| 2006/0225655 A1 | 10/2006 | Faguet et al. | |
| 2011/0139614 A1 | 6/2011 | Ivanov et al. | |
| 2013/0186751 A1* | 7/2013 | Young ................. | H01J 37/3408 204/298.11 |

OTHER PUBLICATIONS

PCT International Search Report and Written Opinion for PCT/US2021/056368 dated Feb. 11, 2022.

* cited by examiner

*Primary Examiner* — Rodney G McDonald
(74) *Attorney, Agent, or Firm* — Moser Taboada

(57) ABSTRACT

Apparatus for physical vapor deposition are provided herein. In some embodiments, a clamp for use in a physical vapor deposition (PVD) chamber includes a clamp body and an outwardly extending shelf that extends from the clamp body, wherein the outwardly extending shelf includes a clamping surface configured to clamp an isolator ring to a chamber body of the PVD chamber, wherein a height of the outwardly extending shelf is about 15 percent to about 40 percent of a height of the clamp body and wherein the clamp body includes a central opening configured to retain a fastener therein.

20 Claims, 4 Drawing Sheets

ISOLATOR RING CLAMP AND PHYSICAL VAPOR DEPOSITION CHAMBER INCORPORATING SAME

FIELD

Embodiments of the present disclosure generally relate to physical vapor deposition processing equipment.

BACKGROUND

Some physical vapor deposition (PVD) chambers often include a ceramic isolator ring disposed between conductive components of the PVD chamber. For example, the ceramic isolator ring electrically insulates a PVD source (e.g., a sputter target) from a source adapter (anode). The isolator ring is a boundary of the PVD vacuum chamber. The inventors have observed that the isolator ring can get stuck to the target o-ring during opening of the chamber, and can fall down, break, and/or otherwise get damaged or can damage the process kit in the PVD chamber and/or the source adapter of the PVD chamber. Damage to the aforementioned parts or components are very expensive and critical for proper PVD chamber performance.

Accordingly, the inventors have provided improved apparatus for PVD processing.

SUMMARY

Apparatus for clamping isolator rings and PVD chambers incorporating same are provided herein. In some embodiments, a clamp for use in a PVD chamber includes a clamp body and an outwardly extending shelf that extends from the clamp body, wherein the outwardly extending shelf includes a clamping surface configured to clamp an isolator ring to a chamber body of the PVD chamber, wherein a height of the outwardly extending shelf is about 15 percent to about 40 percent of a height of the clamp body and wherein the clamp body includes a central opening configured to retain a fastener therein.

In some embodiments, a clamp for use in a processing chamber, includes: a clamp body and an outwardly extending shelf that extends from the clamp body, wherein the outwardly extending shelf includes a clamping surface configured to clamp an isolator ring to a chamber body of the processing chamber, wherein the outwardly extending shelf includes a target facing surface that is sloped at an angle of about 30 degrees to about 85 degrees, and wherein the clamp body includes a central opening configured to retain a fastener therein.

In some embodiments, a processing chamber, includes: a chamber lid disposed atop a chamber body defining an interior volume therein, the chamber lid including a target assembly and the chamber body including an upper chamber adapter; an isolator ring disposed on the upper chamber adapter, wherein the target assembly is supported on the isolator ring; an o-ring disposed between the target assembly and the isolator ring; and one or more isolator ring clamps disposed about the isolator ring to clamp the isolator ring to the upper chamber adapter.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
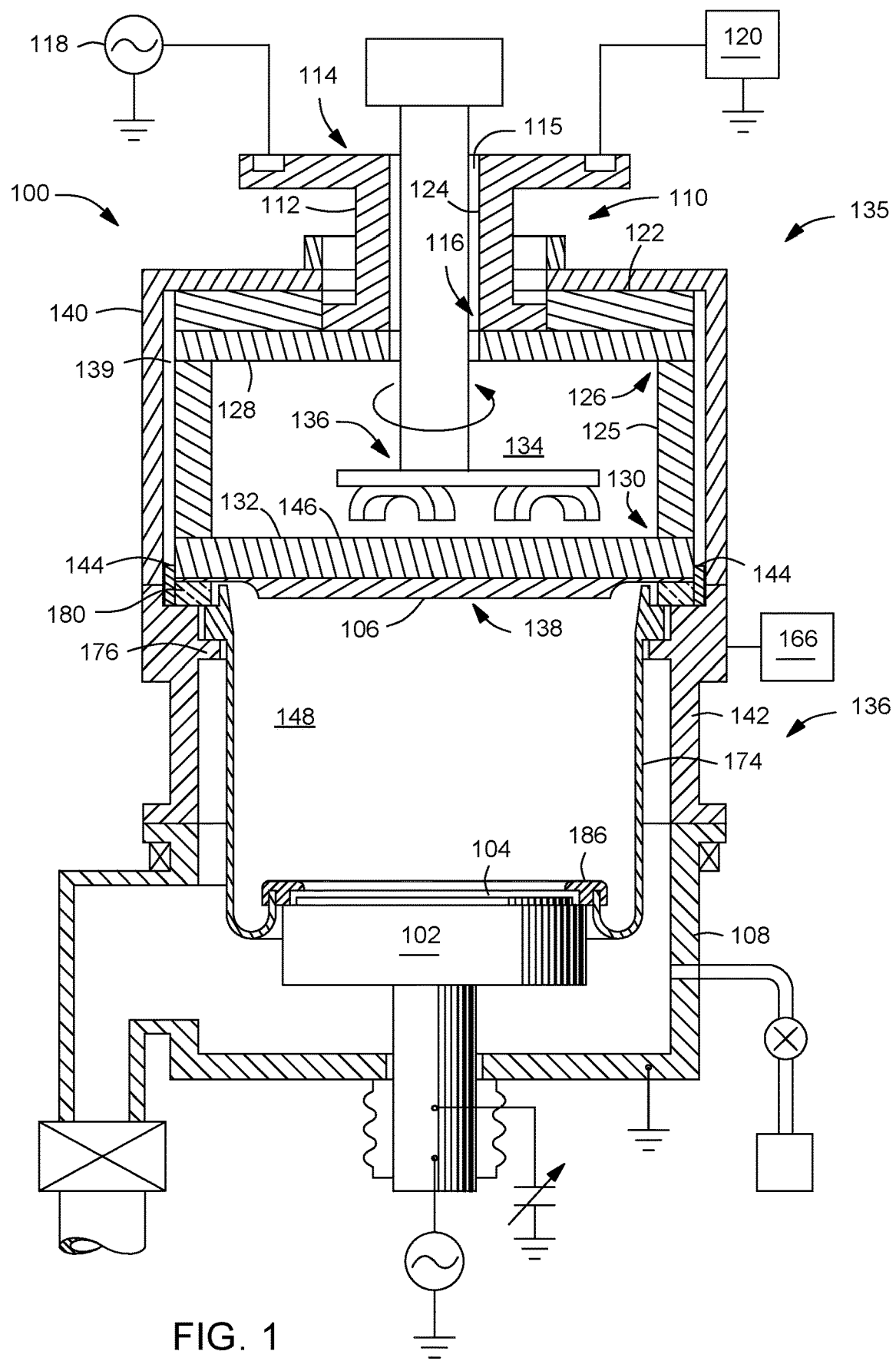
FIG. 1 depicts a schematic cross-sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of improved apparatus for physical vapor deposition (PVD) processing equipment are provided herein. An isolator ring is disposed between a target assembly and an upper chamber adapter of the PVD processing equipment to electrically insulate the target assembly from the upper chamber adapter (anode). The improved apparatus includes one or more clamps configured to clamp the isolator ring to the upper chamber adapter to advantageously prevent the isolator ring from sticking to the target assembly when the target assembly is removed or replaced. The isolator ring sticking to the target assembly may cause the isolator ring to break or damage other chamber components. In some embodiments, as described herein, the inventive apparatus includes a target assembly having a chamfered upper peripheral edge to increase high voltage creepage distance from the target assembly to ground. The chamfered upper peripheral edge advantageously exposes a ledge of an isolator ring disposed between the target assembly and a chamber body. The one or more clamps may be used to clamp the isolator ring to the upper chamber adapter via the ledge.

FIG. 1 depicts a schematic, cross-sectional view of a physical vapor deposition chamber, or processing chamber 100 in accordance with some embodiments of the present disclosure. In some embodiments, the processing chamber 100 has a chamber lid 135 disposed atop a chamber body 136 defining an interior volume 148 therein. In some embodiments, the chamber lid 135 includes a target assembly 138. In some embodiments, the target assembly 138 comprises a target 106 and a target backing plate 146. The target 106 comprises a material to be deposited on the substrate 104 during sputtering, such as a metal or metal oxide. In some embodiments, the target material is a dielectric material, such as silicon or silicon oxide or aluminum oxide. In some embodiments, the target backing plate 146 may comprise a conductive material, such as copper-zinc, copper-chrome, or the same material as the target, such that RF and DC power can be coupled to the target 106 via the target backing plate 146. Alternatively, the target backing plate 146 may be non-conductive and may include conductive elements (not shown) such as electrical feedthroughs or the like.

The processing chamber 100 contains a substrate support pedestal 102 for receiving a substrate 104 thereon. The substrate support pedestal 102 may be located within a grounded enclosure wall 108, which may be a chamber wall (as shown) or a grounded shield. The substrate support pedestal 102 has a material-receiving surface facing the principal surface of the target 106 and supports the substrate 104 to be sputter coated in planar position opposite to the principal surface of the target 106. The substrate support pedestal 102 may support the substrate 104 in the interior volume 148 of the processing chamber 100.

The processing chamber 100 further includes a process shield 174. The process shield 174 generally comprises an annular body disposed about at least a portion of the target 106 and the substrate support pedestal 102. In some embodiments, the process shield 174 is connected to a ledge 176 of an upper chamber adapter 142 of the chamber body 136. The target assembly 138 is supported on an isolator ring 180 atop the process shield 174. The isolator ring 180 may be made of a ceramic material or other nonconductive material. The process shield 174 is fabricated from a conductive material such as aluminum alloy, stainless steel, or the like. The process shield 174 serves to protect other chamber components from damage and/or contamination from the process.

One or more isolator ring clamps 144 are disposed about the isolator ring 180 to clamp the isolator ring 180 to the upper chamber adapter 142. In some embodiments, the one or more isolator ring clamps 144 are spaced about the isolator ring 180. The one or more isolator ring clamps 144 are generally made of a non-conductive material, for example, a polymer material or a ceramic material. In some embodiments, the one or more isolator ring clamps 144 have a height of about 0.75 inches to about 1.5 inches.

In some embodiments, a heater 166 is coupled to the processing chamber 100 and configured to convectively heat the process shield 174. In some embodiments, the process shield 174 is heated to a temperature of about 40 to about 70 degrees Celsius. The inventors have observed that heating the process shield 174 reduces the temperature gradient of the process shield 174, resulting in less particles flaking off the process shield 174.

The process shield 174 extends downwardly and may include a generally tubular portion having a generally constant diameter. The process shield 174 extends along the walls of the upper chamber adapter 142 and the grounded enclosure wall 108 downwardly to below a top surface of the substrate support pedestal 102 and returns upwardly until reaching a top surface of the substrate support pedestal 102. A cover ring 186 rests on the top of the upwardly extending inner portion 188 of the process shield 174 when the substrate support pedestal 102 is in a lower, loading position but rests on the outer periphery of the substrate support pedestal 102 when the substrate support pedestal 102 is in an upper, deposition position to protect the substrate support pedestal 102 from sputter deposition. An additional deposition ring (not shown) may be used to shield the periphery of the substrate 104 from deposition.

The processing chamber includes a feed structure 110 for coupling RF and DC energy to the target 106. The feed structure is an apparatus for coupling RF energy, and optionally DC energy, to the target, or to an assembly containing the target, for example, as described herein. The feed structure 110 includes a body 112 having a first end 114 and a second end 116 opposite the first end 114. In some embodiments, the body 112 further includes a central opening 115 disposed through the body 112 from the first end 114 to the second end 116.

The first end 114 of the feed structure 110 can be coupled to an RF power source 118 and, optionally, a DC power source 120, which can be respectively utilized to provide RF and DC energy to the target 106. For example, the DC power source 120 may be utilized to apply a negative voltage, or bias, to the target 106. In some embodiments, RF energy supplied by the RF power source 118 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure 110 may be fabricated from suitable conductive materials to conduct the RF and DC energy from the RF power source 118 and the DC power source 120.

The second end 116 of the body 112 is coupled to a source distribution plate 122. The source distribution plate includes a hole 124 disposed through the source distribution plate 122 and aligned with the central opening 115 of the body 112. The source distribution plate 122 may be fabricated from suitable conductive materials to conduct the RF and DC energy from the feed structure 110.

The source distribution plate 122 may be coupled to the target 106 via a conductive member 125. The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the target backing plate 146 of the target 106) proximate the peripheral edge of the target 106.

A cavity 134 may be defined by the inner-facing walls of the conductive member 125, the target-facing surface 128 of the source distribution plate 122 and the source distribution plate-facing surface 132 of the target 106. The cavity 134 is fluidly coupled to the central opening 115 of the body 112 via the hole 124 of the source distribution plate 122. The cavity 134 and the central opening 115 of the body 112 may be utilized to at least partially house one or more portions of a rotatable magnetron assembly 136 as illustrated in FIG. 1. In some embodiments, the cavity 134 may be at least partially filled with a cooling fluid, such as water ($H_2O$) or the like.

A ground shield 140 may be provided to cover the outside surfaces of the lid of the processing chamber 100. The ground shield 140 may be coupled to ground, for example, via the ground connection of the chamber body 136. The ground shield 140 has a central opening to allow the feed structure 110 to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the source distribution plate 122, the conductive member 125, and the target 106 (and/or target backing plate 146) to prevent the RF and DC energy from being routed directly to ground. The insulative gap may be filled with air or some other suitable dielectric material, such as a ceramic, a plastic, or the like.

Figure 2:
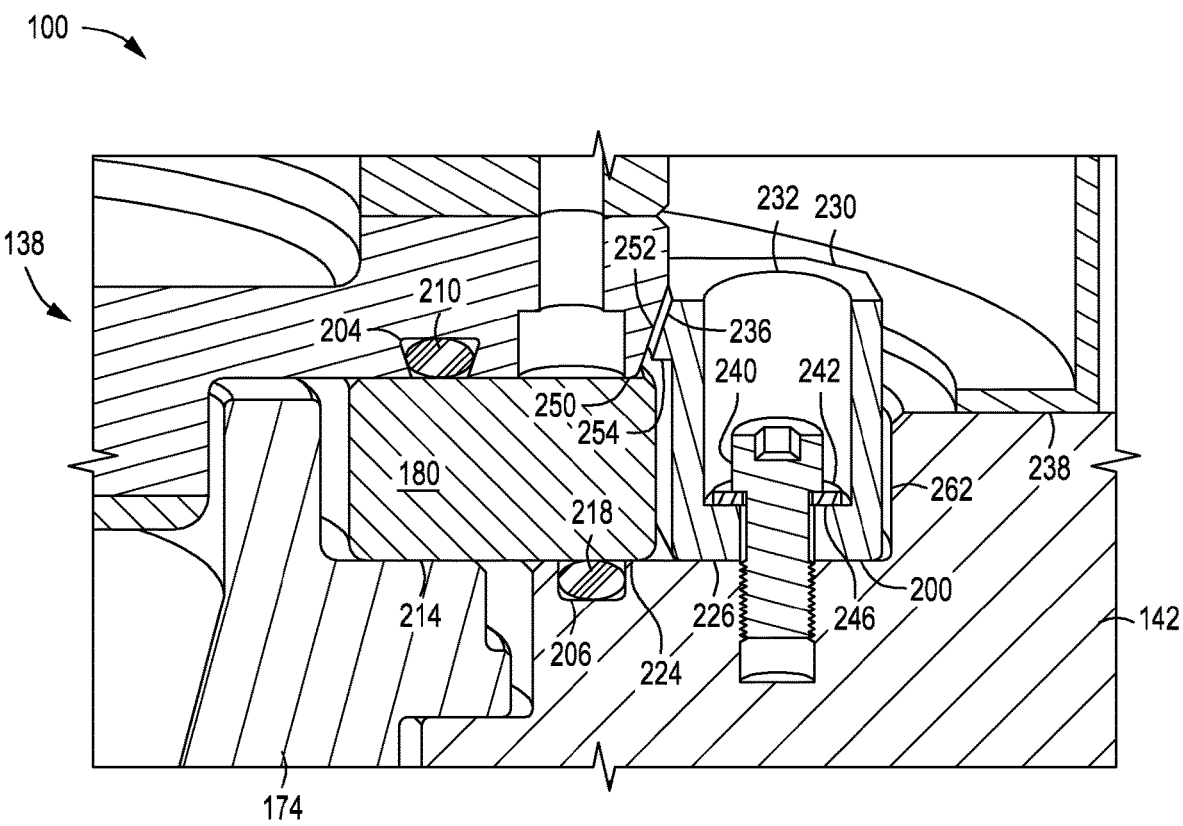
FIG. 2 depicts a sectional view of a target and surrounding structure in accordance with some embodiments of the present disclosure.

FIG. 2 depicts a sectional view of a target assembly and surrounding structure in accordance with some embodiments of the present disclosure. In some embodiments, the target assembly 138 includes a peripheral edge 252 that is chamfered. In some embodiments, the peripheral edge 252 that is chamfered exposes a ledge 250 at an upper peripheral region of the isolator ring 180.

In some embodiments, the target assembly 138 includes an o-ring groove 204 on a lower peripheral edge thereof. An o-ring 210 is disposed in the o-ring groove 204 to form a seal between the target assembly 138 and the isolator ring 180. In some embodiments, the upper chamber adapter 142 includes a second o-ring groove 206 on a sealing surface 224 thereof. A second o-ring 218 may be disposed in the second o-ring groove 206 to form a seal between the upper chamber adapter 142 and the isolator ring 180.

In use, the o-ring 210 may cause the isolator ring 180 to stick to the target assembly 138. The processing chamber 100 includes one or more isolator ring clamps 230. In some embodiments, the one or more isolator ring clamps 230 are the one or more isolator ring clamps 144 of FIG. 1. The one or more isolator ring clamps 144 clamp the isolator ring 180 to the upper chamber adapter 142 to advantageously prevent the isolator ring 180 from sticking to the target assembly 138 when the target assembly 138 is raised. The second o-ring 218 may cause the upper chamber adapter 142 to stick to the isolator ring 180. In some embodiments, a lower surface 200 of each of the one or more isolator ring clamps 230 is coplanar with a lower surface 214 of the isolator ring 180 to advantageously permit a tool to enter between the isolator ring 180 and the upper chamber adapter 142 to separate the two components.

In some embodiments, each of the one or more isolator ring clamps 230 is disposed in a pocket 262 formed on an upper surface 238 of the upper chamber adapter 142. In some embodiments, the pocket 262 extends radially outward from an inner surface of the upper chamber adapter 142. In some embodiments, a lower surface 226 of the pocket 262 is coplanar with the sealing surface 224 of the upper chamber adapter 142.

In some embodiments, the one or more isolator ring clamps 230 comprise two clamps. In some embodiments, the one or more isolator ring clamps 230 comprise two or more clamps arranged at regular intervals about the isolator ring 180. In some embodiments, the one or more isolator ring clamps 230 are diametrically opposed about the isolator ring 180.

In some embodiments, the one or more isolator ring clamps 230 include a clamp body 264 and an outwardly extending shelf 236 that extends from the clamp body 264. In some embodiments, a height of the outwardly extending shelf 236 is about 15 percent to about 40 percent of a height of the clamp body 264. The outwardly extending shelf 236 includes a clamping surface 254 configured to clamp the isolator ring 180. In some embodiments, the clamping surface 254 is a lower surface of the outwardly extending shelf 236. In some embodiments, the one or more isolator ring clamps 230 include a central opening 232. In some embodiments, the one or more isolator ring clamps 230 are coupled to the upper chamber adapter 142 via one or more fasteners 240 that extend through the central opening 232 of each of the one or more isolator ring clamps 230 and into the upper chamber adapter 142. In some embodiments, a washer 242 is disposed between each of the one or more fasteners 240 and a seat 246 formed in the central opening 232.

Figure 3A:
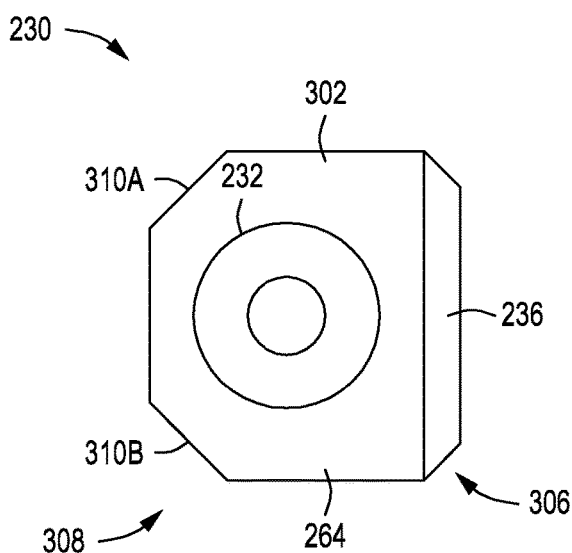
FIG. 3A depicts a top view of an isolator ring clamp in accordance with some embodiments of the present disclosure.
Figure 3B:
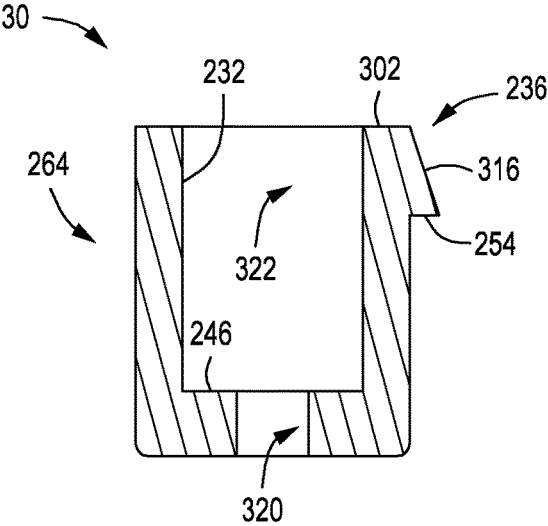
FIG. 3B depicts a cross-sectional side view of an isolator ring clamp in accordance with some embodiments of the present disclosure.

FIG. 3A depicts a top view of a clamp of the one or more isolator ring clamps 230 in accordance with some embodiments of the present disclosure. FIG. 3B depicts a cross-sectional side view of a clamp of the one or more isolator ring clamps 230 in accordance with some embodiments of the present disclosure. Each of the one or more isolator ring clamps 230 generally include the outwardly extending shelf 236 on a first side 306 and an opposing second side 308. In some embodiments, the second side 308, or side opposite the outwardly extending shelf 236, includes beveled sidewalls 310A, 310B. In some embodiments, the one or more isolator ring clamps 230 have a shape corresponding with a shape of the pocket 262.

In some embodiments, a lower portion 320 of the central opening 232 has a diameter smaller than an upper portion 322 of the central opening 232, where an interface between the upper portion 322 and the lower portion 320 define the seat 246. In some embodiments, the outwardly extending shelf 236 includes a target facing surface 316 that is sloped. In some embodiments, the target facing surface 316 extends downward and outward at a substantially constant angle. In some embodiments, the constant angle is about 45 degrees to about 85 degrees. In some embodiments, the outwardly extending shelf 236 extends about 0.04 to about 0.14 inches from the clamp body 264. In some embodiments, the target facing surface 316 extends downward from an upper surface 302 of each of the one or more isolator ring clamps 230.

Figure 4:
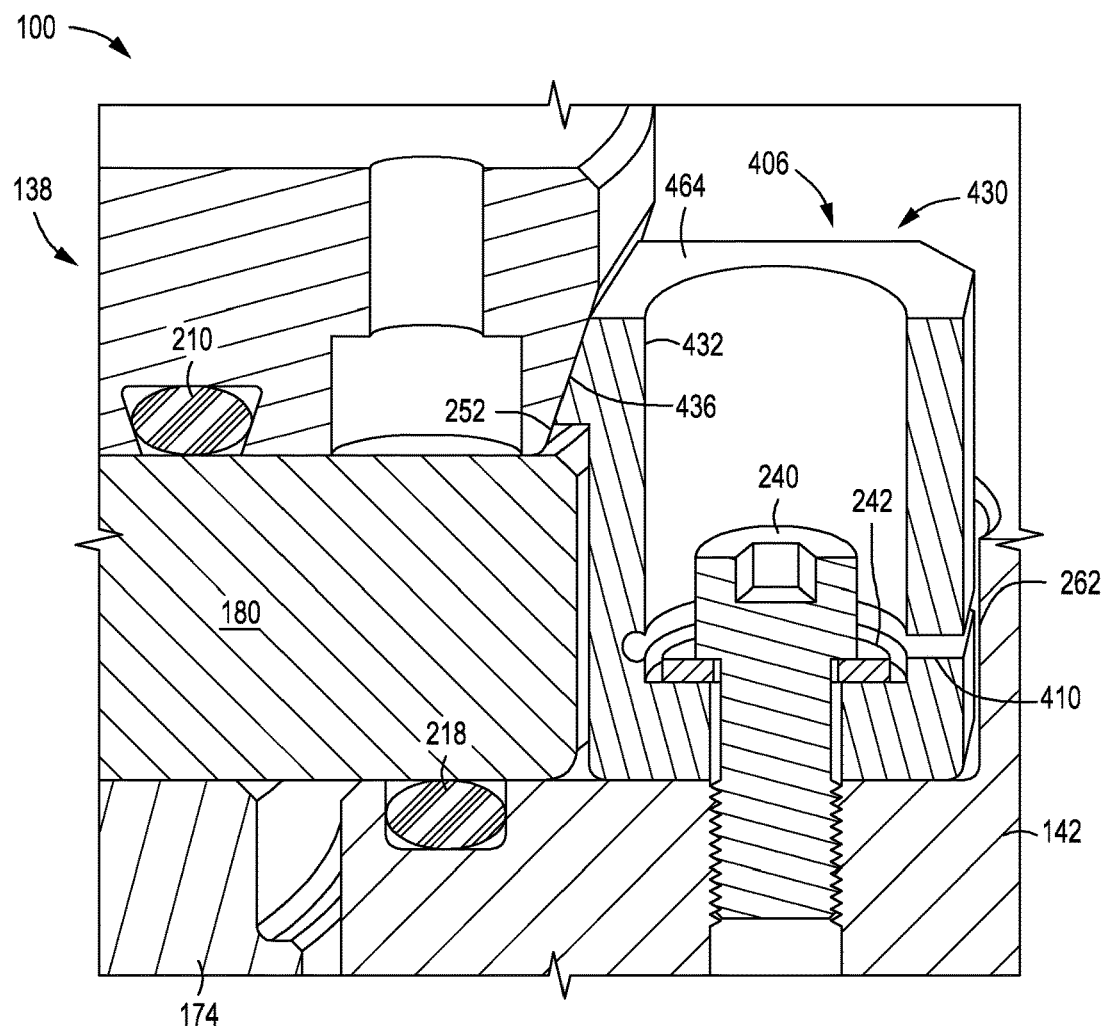
FIG. 4 depicts a sectional view of a target and surrounding structure in accordance with some embodiments of the present disclosure.
Figure 5:
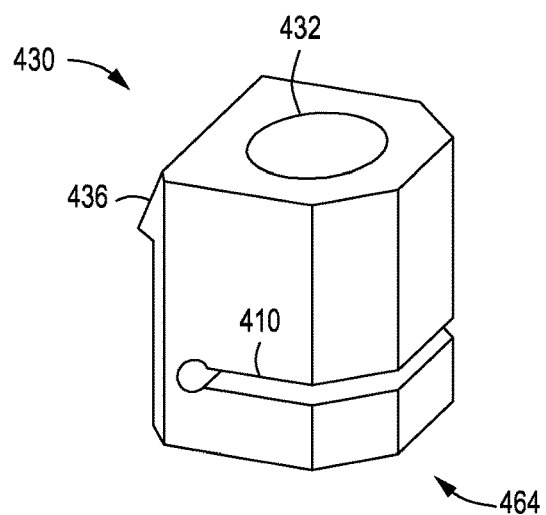
FIG. 5 depicts an isometric view of an isolator ring clamp in accordance with some embodiments of the present disclosure.

FIG. 4 depicts a sectional view of the target assembly 138 and surrounding structure in accordance with some embodiments of the present disclosure. FIG. 5 depicts an isometric view of a clamp of one or more isolator ring clamps 430 in accordance with some embodiments of the present disclosure. In some embodiments, the one or more isolator ring clamps 430 are the one or more isolator ring clamps 144 of FIG. 1. In some embodiments, the one or more isolator ring clamps 430 are similar to the one or more isolator ring clamps 230 except that the one or more isolator ring clamps 430 have a horizontal slot 410 extending from a first side 406 of the one or more isolator ring clamps 430 to a central opening 432 of the one or more isolator ring clamps 430. In some embodiment, the horizontal slot 410 extends from the first side 406 of the isolator ring clamp 430 at least to an opposite second side of the isolator ring clamp 430. The horizontal slot can extend into, but does not extend completely through, the second side. A stress-relief radius, such as a hole formed with a slightly larger diameter than a width of the horizontal slot 410, can be provided at the end of the horizontal slot 410 to reduce stress and likelihood of cracking or breakage of the clamp from repeated cycling of the clamp. The one or more isolator ring clamps 430 include an outwardly extending shelf 436 that extends from a clamp body 464 similar to the outwardly extending shelf 236. The horizontal slot 410 extending through the clamp body 464 advantageously provides flexibility to the one or more isolator ring clamps 430, urging the outwardly extending shelf 436 over the isolator ring 180 (i.e., self-clamping feature). In some embodiments, the self-clamping feature may facilitate the one or more isolator ring clamps 430 to be used with a target assembly 138 having a peripheral edge 252 that is not chamfered or that has a smaller chamfer.

Figure 6:
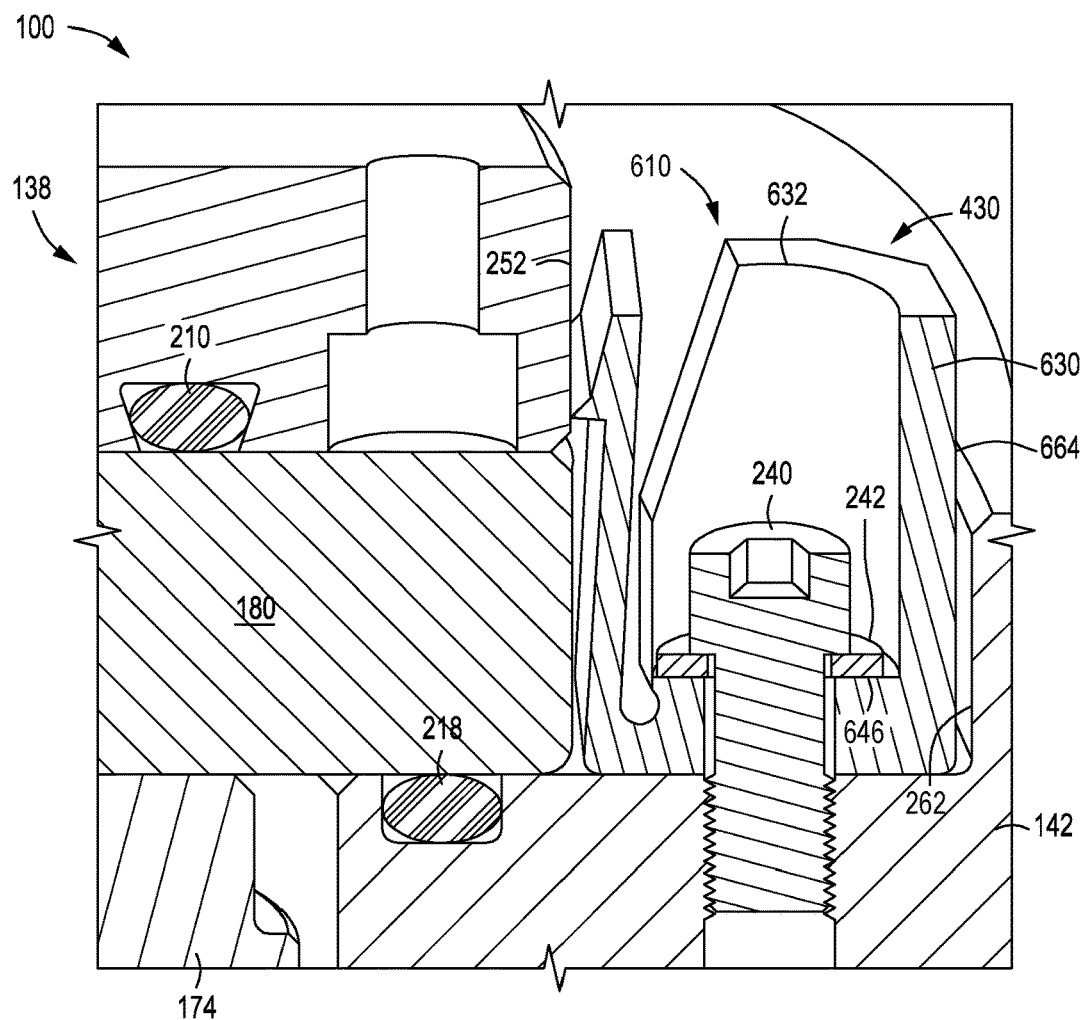
FIG. 6 depicts a sectional view of a target and surrounding structure in accordance with some embodiments of the present disclosure.
Figure 7:
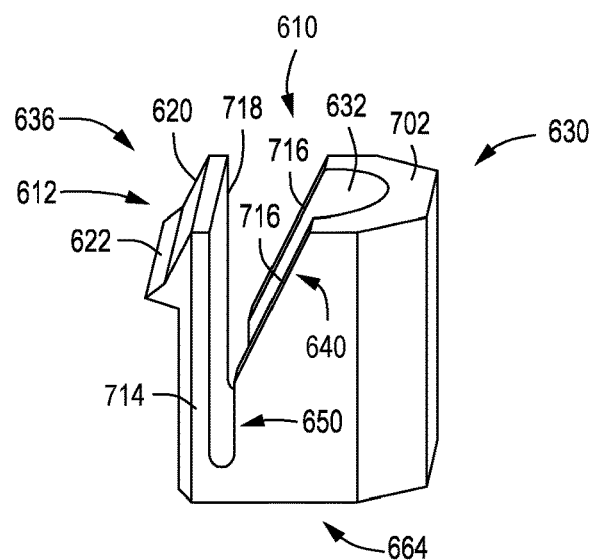
FIG. 7 depicts an isometric view of an isolator ring clamp in accordance with some embodiments of the present disclosure.

FIG. 6 depicts a sectional view of a target and surrounding structure in accordance with some embodiments of the present disclosure. FIG. 7 depicts an isometric view of a clamp of the one or more isolator ring clamps 630 in accordance with some embodiments of the present disclosure. In some embodiments, the one or more isolator ring clamps 630 include a vertical slot 610 to provide flexibility to the one or more isolator ring clamps 630. The vertical slot 620 partially defines a front wall 714 having the outwardly extending shelf 636.

The front wall 714 acts as a flexure or spring such that the shelf 636 can be pushed out of the way (i.e., retracted) as the isolator ring 180 is installed or as the one or more isolator ring clamps 630 are installed after the isolator ring 180. When the front wall 714 is retracted, the vertical slot 610 advantageously provides space for the front wall 714 to be retracted or pushed away from the normal upright position, thus providing a bias force toward the normal upright, or unretracted position. The bias force urges front wall 714 toward the isolator ring 180 such that the outwardly extending shelf 636 extends over an edge of the isolator ring 180 (i.e., self-clamping feature). In some embodiments, the self-clamping feature may facilitate the one or more isolator ring clamps 630 to be used with a target assembly 138 having a peripheral edge 252 that is chamfered, as shown in FIG. 2, less-chamfered, as shown in FIG. 6, or not chamfered.

The one or more isolator ring clamps 630 include a clamp body 664 and an outwardly extending shelf 636 that extends from the clamp body 664. The outwardly extending shelf 636 includes a target facing surface 512 that is sloped. In some embodiments, the target facing surface 612 includes an upper portion 620 having a first slope. In some embodiments, the target facing surface 612 includes a lower portion 622 having a second slope. In some embodiments, the second slope is different than the first slope. In some embodiments, the first slope is about 45 degrees to about 85 degrees downward and outward from an upper surface 702 of the one or more isolator ring clamps 630. In some embodiments, the second slope is about 30 degrees to about 50 degrees downward and outward from an upper surface 702 of the one or more isolator ring clamps 630. In some embodiments, the second slope is less than a first slope to advantageously extend between the target assembly 138 and the isolator ring 180. In some embodiments, the lower portion 622 has a vertical height of about 0.02 to about 0.05 inches.

In some embodiments, the vertical slot 610 includes an upper portion 640 and a lower portion 650. In some embodiments, the upper portion 640 of the vertical slot 610 is wider than the lower portion 650 to advantageously increase a flexibility of the one or more isolator ring clamps 630. The upper portion 640 extends between the outwardly extending shelf 636 and a central opening 632 of the one or more isolator ring clamps 630. In some embodiments, the vertical slot 610 extends past a seat 646 in the central opening 632. In some embodiments, a width of the upper portion 640 is defined between a pair of first surfaces 716 and an opposing second surface 718. In some embodiments, the pair of first surfaces 716 taper downward and toward the second surface 718.

While the foregoing is directed to embodiments of the present disclosure, other and further embodiments of the disclosure may be devised without departing from the basic scope thereof.

The invention claimed is:

1. A clamp for use in a physical vapor deposition (PVD) chamber, comprising:
a clamp body and an outwardly extending shelf that extends from the clamp body, wherein the outwardly extending shelf includes a clamping surface configured to clamp an isolator ring to a chamber body of the PVD chamber, wherein a height of the outwardly extending shelf is about 15 percent to about 40 percent of a height of the clamp body and wherein the clamp body includes a central opening configured to retain a fastener therein.

2. The clamp of claim 1, wherein the clamp body includes a vertical slot extending from an upper surface of the clamp body.

3. The clamp of claim 2, wherein the vertical slot includes an upper portion and a lower portion, wherein the upper portion is wider than the lower portion.

4. The clamp of claim 1, wherein the clamp body includes a horizontal slot extending from a first side of the clamp body to the central opening.

5. The clamp of claim 1, wherein the clamp is made of a polymer material.

6. The clamp of claim 1, wherein the outwardly extending shelf includes a target facing surface that is sloped.

7. The clamp of claim 6, wherein the target facing surface is sloped at an angle of about 45 degrees to about 85 degrees.

8. The clamp of claim 6, wherein the target facing surface includes an upper portion having a first slope and a lower portion having a second slope, wherein the second slope is different than the first slope.

9. The clamp of claim 1, wherein the clamp body includes beveled sidewalls on a side of the clamp body opposite the outwardly extending shelf.

10. A clamp for use in a processing chamber, comprising:
a clamp body and an outwardly extending shelf that extends from the clamp body, wherein the outwardly extending shelf includes a clamping surface configured to clamp an isolator ring to a chamber body of the processing chamber, wherein the outwardly extending shelf includes a target facing surface that is sloped at an angle of about 30 degrees to about 85 degrees, and wherein the clamp body includes a central opening configured to retain a fastener therein.

11. The clamp of claim 10, wherein the target facing surface is sloped at a constant angle.

12. The clamp of claim 10, wherein the outwardly extending shelf extends about 0.04 to about 0.14 inches from the clamp body.

13. The clamp of claim 10, wherein the clamp body has a height of about 0.75 inches to about 1.5 inches.

14. A processing chamber, comprising:
a chamber lid disposed atop a chamber body defining an interior volume therein, the chamber lid including a target assembly and the chamber body including an upper chamber adapter;
an isolator ring disposed on the upper chamber adapter, wherein the target assembly is supported on the isolator ring;
an o-ring disposed between the target assembly and the isolator ring; and
one or more isolator ring clamps disposed about the isolator ring to clamp the isolator ring to the upper chamber adapter.

15. The processing chamber of claim 14, further comprising a process shield connected to a ledge of the upper chamber adapter.

16. The processing chamber of claim 14, wherein the one or more isolator ring clamps are disposed in pockets formed on an upper surface of the upper chamber adapter.

17. The processing chamber of claim 14, wherein the one or more isolator ring clamps include a central opening and a fastener is disposed in the central opening to couple the one or more isolator ring clamps to the upper chamber adapter.

18. The processing chamber of claim 14, wherein the target assembly comprises a target and a target backing plate.

19. The processing chamber of claim 14, wherein the target assembly includes a peripheral edge that is chamfered.

20. The processing chamber of claim 14, wherein the one or more isolator ring clamps comprise two or more clamps disposed at regular intervals about the isolator ring.

* * * * *